(12) United States Patent
Agarwal et al.

(10) Patent No.: US 7,545,176 B2
(45) Date of Patent: Jun. 9, 2009

(54) ENERGY-SAVING CIRCUIT AND METHOD USING CHARGE EQUALIZATION ACROSS COMPLEMENTARY NODES

(75) Inventors: Vikas Agarwal, Austin, TX (US); Sanjay Dubey, Austin, TX (US); Saiful Islam, Austin, TX (US); Gaurav Mittal, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/923,714

(22) Filed: Oct. 25, 2007

(65) Prior Publication Data

US 2009/0108920 A1    Apr. 30, 2009

(51) Int. Cl.
*H03K 19/0175* (2006.01)
*H03K 19/094* (2006.01)

(52) U.S. Cl. ............................ 326/86; 326/90; 326/113

(58) Field of Classification Search .................. 326/86, 326/90, 113, 12–127
See application file for complete search history.

(56) References Cited

U.S. PATENT DOCUMENTS

| | | | |
|---|---|---|---|
| 5,568,515 A * | 10/1996 | Wincn | 375/257 |
| 5,781,469 A | 7/1998 | Pathak et al. | |
| 5,973,972 A * | 10/1999 | Kwon et al. | 365/203 |
| 6,587,385 B2 * | 7/2003 | Ooishi | 365/191 |

* cited by examiner

*Primary Examiner*—Anh Q Tran
(74) *Attorney, Agent, or Firm*—Mitch Harris, LLC; Andrew M. Harris; Casimer K. Salys

(57) ABSTRACT

An energy-saving circuit and method using charge equalization across complementary nodes reduces power consumption in memory circuits and other circuits such as wide multiplexers having complementary high-capacitance nodes. A change detection circuit detects a state change to be applied to the bitlines, and generates a pulse if a state change is to be applied. A pass gate connected between the nodes is activated in response to the pulse to equalize the charge on the bitlines. The driver circuit enable inputs are also delayed, so that the bitlines are not driven until after the charge has been equalized and the pass gate disabled. In one embodiment, the driver circuits are only enabled momentarily by a pulsed output of the change detector and keeper circuits are employed to retain the bitlines in their asserted states.

20 Claims, 5 Drawing Sheets

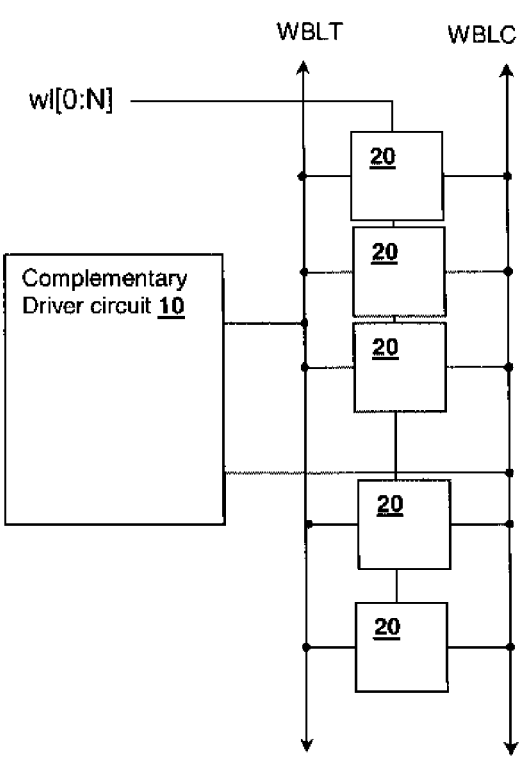
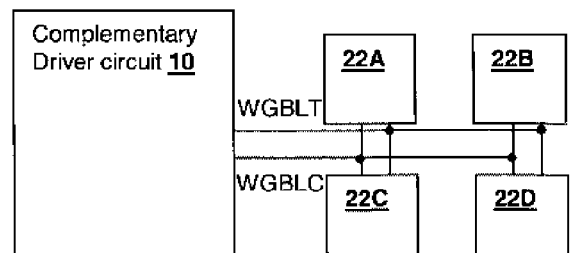
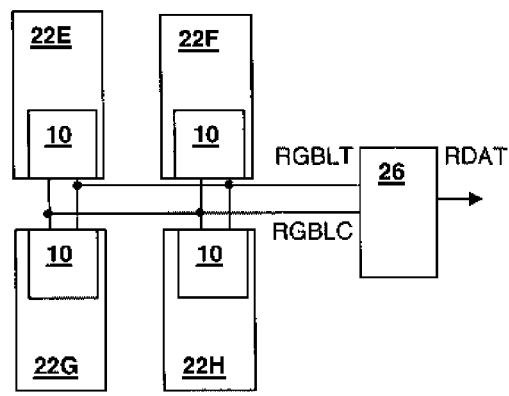
Fig. 2A
Fig. 2B
Fig. 2C

ENERGY-SAVING CIRCUIT AND METHOD USING CHARGE EQUALIZATION ACROSS COMPLEMENTARY NODES

BACKGROUND OF THE INVENTION

1. Technical Field

The present invention relates generally to complementary logic circuits, and more particularly to a logic circuit that reduces energy consumption by sharing charge between complementary nodes having large capacitance prior to setting the final state of the nodes.

2. Description of the Related Art

Logic circuits in general, and storage circuits in particular, have energy consumption largely dictated by the large capacitances that must be charged and discharged to change the logic state of the signal nods. For example, in storage circuits, complementary bitlines are set to states dictated by the input or output storage value. During a state change, one of the bitlines is discharged and the other is charged, with an energy consumption equal to $CV^2$ where C is the total capacitance of the bitlines and V is the total power supply voltage. In large arrays, both global and local bitlines are changed to provide an state change. Further, in circuits such as wide multiplexers, the select lines are also large capacitance nodes that consume large amounts of energy when their selection state is changed.

Bitlines and multiplexer selection lines, by their nature, are relatively high capacitance nodes, since they are connected to a large number of elements. The energy consumed in charging and discharging the nodes typically forms the dominant energy-consumer when a storage device is active. Since memory devices are on-par with processors today as energy-consumers in computer systems, reduction of energy consumption in memory devices is highly desirable. In processors, multiplexers are used pervasively to select between values, and are therefore operated at a very high frequency. Therefore, reduction in energy usage due changes in selection state of wide multiplexers can provide for significant reduction in energy consumption of processors and other very large-scale integrated (VLSI) logic circuits. Further, a significant portion of processor energy consumption is also involved in operation of internal storage arrays such as register files that also use bitlines, and therefore reduction in storage array energy consumption also may also provide for reduction in processor power consumption.

It is therefore desirable to provide a logic circuit and method that reduces energy consumption due to charging and/or discharging large capacitance nodes. It is further desirable to provide storage circuits and multiplexers having reduced energy consumption.

SUMMARY OF THE INVENTION

The objective of reducing energy consumption in dynamic circuits having large capacitive nodes, and in particular, reduction of energy consumption in storage and multiplexer circuits, is accomplished in a complementary logic circuit and its method of operation.

The complementary logic circuit has complementary nodes that are coupled via a pass gate. An input receives a signal indicating a next state of the nodes, and the input is coupled to a state change detector that generates a pulse in response to a detected state change. The output of the state generator is used to enable the pass gate while the pulse is active, causing the nodes to start equalizing in voltage. At the end of the pulse, driver circuits set the final state of the nodes.

The nodes are generally high capacitance nodes, such as storage register bitlines and wide multiplexer select lines, so that additional energy consumed by the pulse generator and pass gate is small compared to the energy savings due to the equalization of the nodes by the activation of the transmission gate. The driver circuits may be continually or periodically active after the pulse has ended, in order to set the final state of the nodes. Alternatively, the pulse generator may provide second pulse output to activate the driver circuits, and keeper circuits employed to maintain the state of the nodes after the second pulse has ended.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

FIGS. 2A-2C are block diagrams of storage circuits in accordance with embodiments of the invention.

DESCRIPTION OF ILLUSTRATIVE EMBODIMENT

The present invention concerns a driver circuit for driving complementary signal lines having significant load capacitance. The driver circuit reduces power consumption in circuits employing the techniques of the present invention, by initially coupling the complementary signal lines together to discharge/charge the complementary signal lines toward their average DC voltage when the driver circuit is commanded to change the state of the signal lines. By providing the initial portion (generally half) of the voltage change on each of the complementary signal lines, the active portion of the driver circuit need only supply current during approximately half of the voltage transitions, reducing the power consumption of the driver circuit by approximately half.

Figure 1:
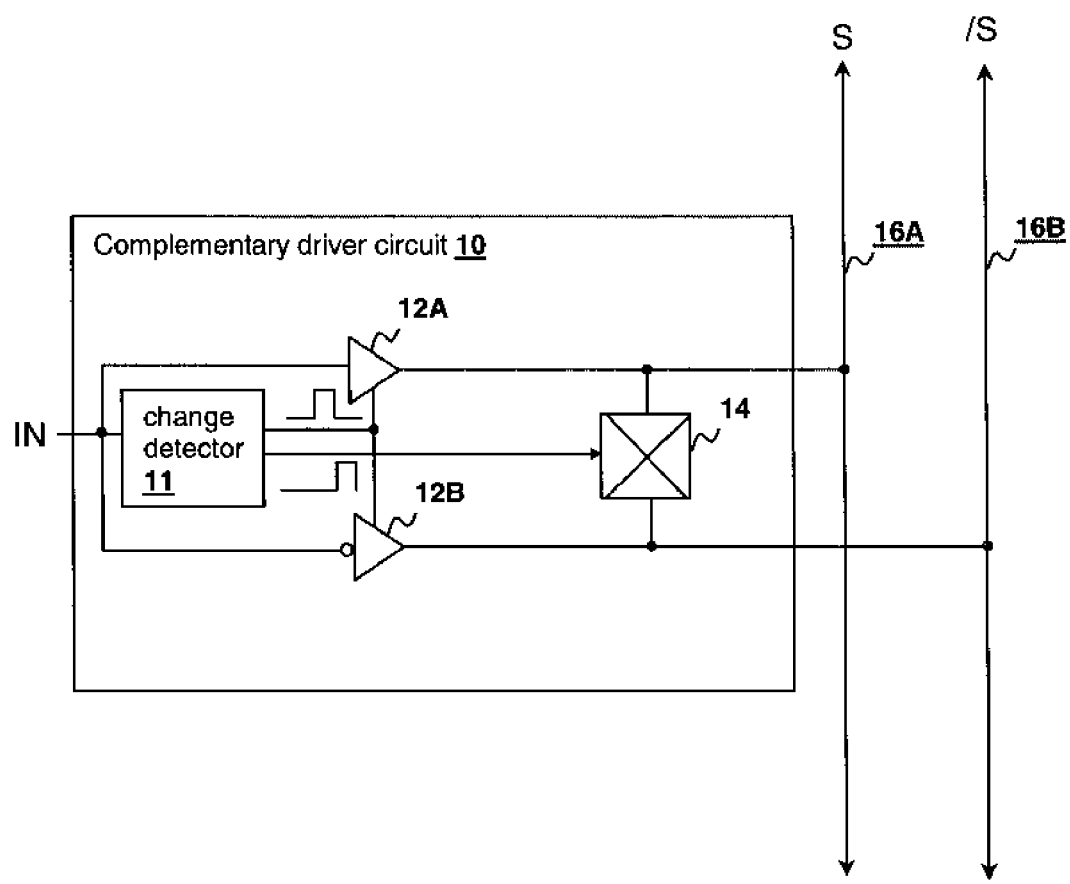
FIG. 1 is a block diagram of a driver circuit in accordance with an embodiment of the invention.

With reference now to the figures, and in particular with reference to FIG. 1, a block diagram of a driver circuit 10, in accordance with an embodiment of the invention is shown. Driver circuit 10 provides outputs to drive complementary signal S and /S onto corresponding signal lines 16A and 16B, respectively. Signal lines 16A and 16B are signal lines having a high capacitance value such as storage device bitlines, wide multiplexer select lines, or any complementary set of signal lines that are connected to a large number of capacitive loads, such as signal lines connected to a large number of transistor gates. Driver circuit 10 includes a change detector 11 that determines when a state change provided at the input IN of driver circuit 11 is changing state, therefore requiring a state change in each of the complementary signal pair formed by signals S and /S. Change detector 11 generates a first output pulse that activates a pass gate 14 to coupled signal lines 16A and 16B together while the first pulse is active. As shown, change detector 11 also generates a second pulse that enables activates line driver circuits 12A and 12B, which provide drive outputs controlled by input signal IN to complete the operation of charging/dis-charging signal lines 16A and 16B to complete the state change. As will be illustrated in further detail below, the second pulse is not required for all embodiments of the invention as the driver circuits can be designed so as not to generate undesired currents through pass gate 14. The length of the pulse generated by change detector 11 is desirably selected to be of sufficient length to provide for complete equalization of the voltage on signal lines 16A and 16B, but short enough to prevent any additional circuit delay. However, in delay-critical applications, it is not necessary for the pass gate to be enabled for the full duration required to equalize the voltages, and improvement through reduction in energy consumption can be had at shorter pulse widths.

Referring now to FIGS. 2A-2C, application of driver circuit 10 of FIG. 1 in various storage device circuits in accordance with embodiments of the invention is shown. FIG. 2A illustrates driver circuit 10 connected to complementary write bitlines WBLT and WBLC, which are local write bitlines connected to storage elements 20 and enabled by wordline signals w1[0:N]. Driver circuit 10 writes values to complementary global write bitlines WGBLT and WGBLC in accordance with the local write data input signal WLDAT. FIG. 2B illustrates driver circuit 10 connected to complementary global write bitlines WGBLT and WGBLC, which are connected to subarrays 22A-22D. Driver circuit 10 writes values to complementary global write bitlines WGBLT and WGBLC in accordance with the write data input signal WDAT. Finally, FIG. 2C shows application of driver circuits 10 within storage subarrays 22E-22H to drive complementary global read bitlines RGBLT and RGBLC that provide the final read output to output circuit 26 from the individual read circuit outputs of subarrays 22E-22H, to generate a read data signal RDAT from the entire array. While the Figures illustrate separate read and write bitlines, it is understood that the invention may be applied to any combination of global read/write bitlines and local write bitlines.

Figure 3:
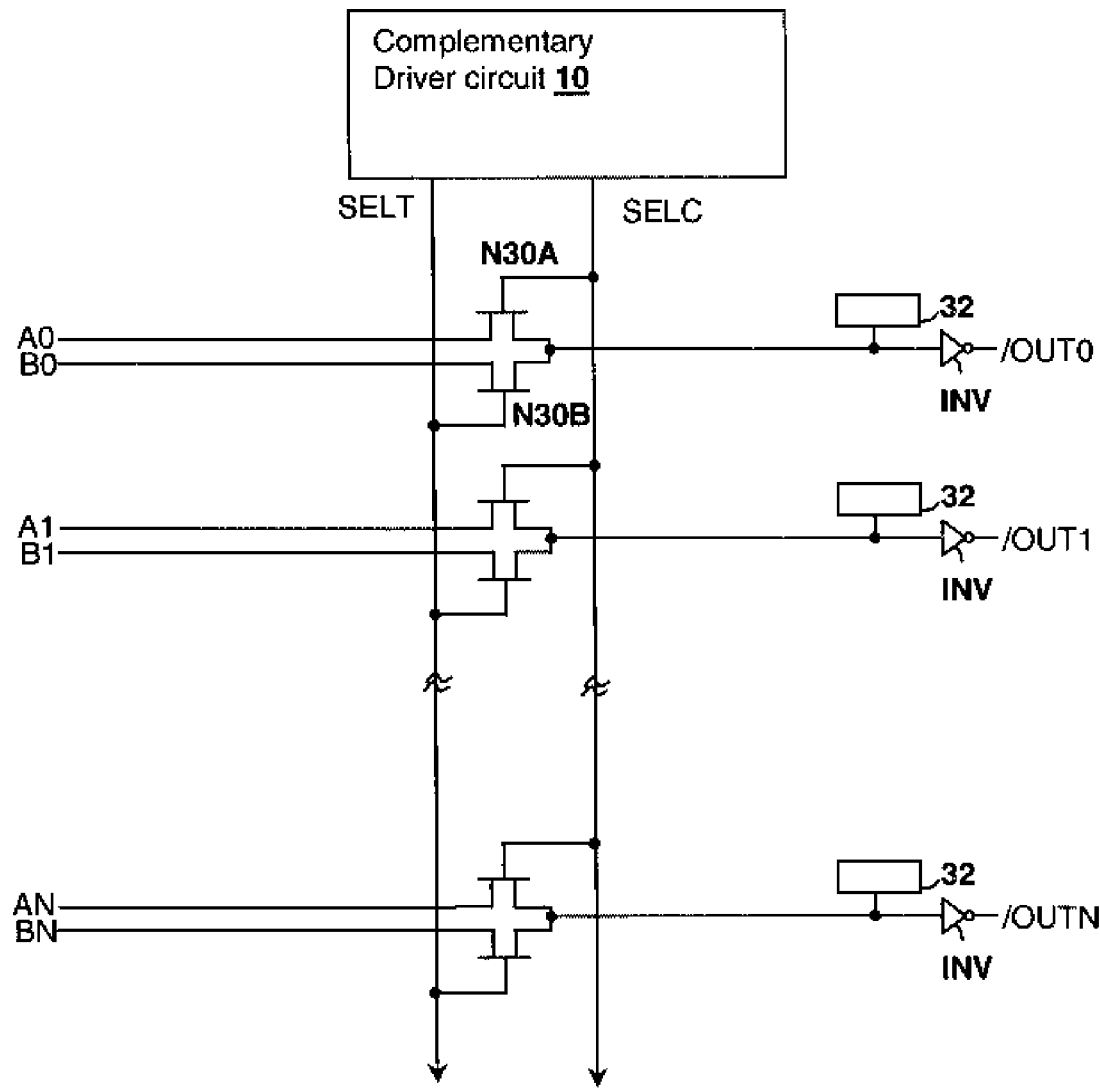
FIG. 3 is a block diagram of a multiplexer circuit in accordance with an embodiment of the invention.

Referring now to FIG. 3, application of driver circuit 10 in a multiplexer circuit is shown, in accordance with an embodiment of the invention. The depicted embodiment is a dynamic multiplexer having pre-charge circuits 32, however since the complementary select inputs are the same for both static and dynamic configurations, the advantages apply equally to both static and dynamic multiplexer circuits. Transistor N30A or N30B is activated depending on the state of complementary select lines SELT and SELC. In applications such as processor pipeline path switching, multiplexers are frequently very wide, having 64, 128 or more selection devices with gates connected to complementary select lines SELT and SELC for controlling the transistors to select between inputs A[0:N] and inputs B[0:N] to produce selected outputs /OUT[0:N]. Such multiplexers are also typically operated at very high transition rates, extending to the full processor cycle frequency. Therefore, the energy consumption savings provided by driver circuit 10 makes the illustrated multiplexer application advantageous over prior art multiplexer select line driver circuits.

Figure 4A:
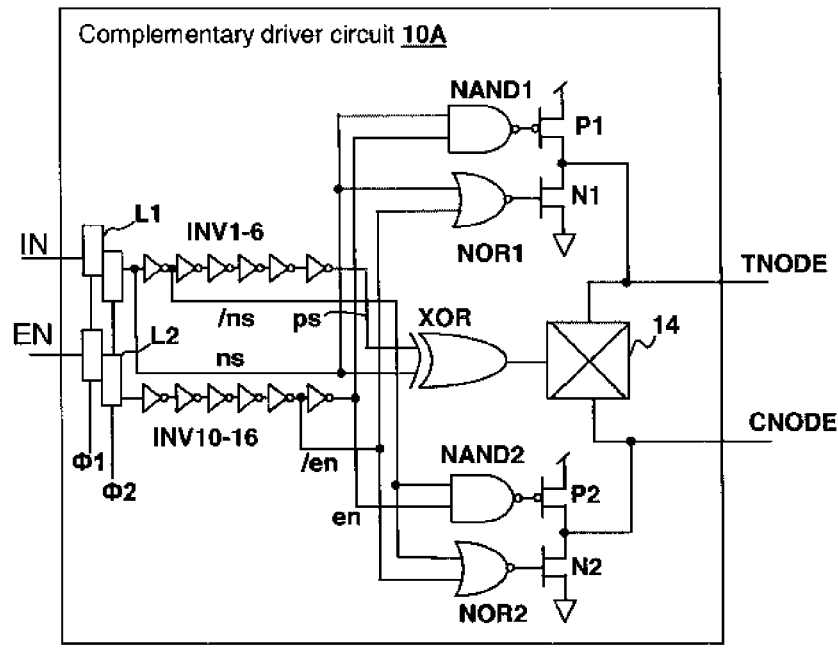
FIG. 4A is a schematic diagram of a driver circuit in accordance with an embodiment of the invention.

Referring now to FIG. 4A, a driver circuit 10A that can be used to implement the above-described driver circuit 10 of FIGS. 1, FIGS. 2A-2C and FIG. 3, is illustrated in accordance with an embodiment of the present invention. Input signal IN is captured by a two-stage latch L1 according to clock phase signals Φ1 and Φ2. An enable signal EN is captured by a two-stage latch L2 according to clock phase signals Φ1 and Φ2. A Delay line formed by inverter chain INV1-6 provides a next state signal ns, a slightly delayed complement next state signal /ns and a present state signal ps, which are used to operate the line driver and change detector circuits of driver circuit 10. The change detector circuit is provided by a logical exclusive-OR gate XOR1 which generates a positive pulse when next state signal ns and present state signal ps, which is provided to the control input of pass gate 14 to momentarily couple a pair of complementary output nodes TNODE and CNODE to equalize their voltage.

The line driver circuit for output node TNODE is provided by an inverted formed by transistors P1 and N1, which are controlled by a logical-NAND gate NAND1 and a logical NOR-gate NOR1. Logical-NAND gate NAND1 activates transistor P1 when present state signal ps and an enable signal en, provided by the output of another delay line formed by inverter chain INV10-16 from the output of latch L2, are both in a logical "1" state. Logical-NOR gate NOR1 activates transistor N1 when next state signal ns and an inverted enable signal /en, provided by inverter chain INV10-16, are both in a logical "0" state. Therefore, the inverter formed by transistors P1 and N1 is a tri-state inverter with an enable input provided in response to enable signal en and has an output state determined by the state of next state signal ns. Therefore, output node TNODE will be coupled to output node CNODE during the pulse generated by exclusive-OR gate XOR1, causing the voltages on output nodes TNODE and CNODE to start to equalize and at the end of the pulse, the tri-state inverter formed by transistors P1, N1, logical-NAND gate NAND1 and logical NOR-gate NOR1 will drive output node TNODE to the proper next state according to next state signal ns. Similarly, transistors P2 and N2, a logical-NAND gate NAND2 and a logical NOR-gate NOR2 provide another tri-state inverter that is enabled by the enable signals en and /en and has an active output state determined by inverted next state signal /ns, providing the proper next state for output node CNODE after the pulse that enables pass gate 14 has ended. After enable signal en has been de-asserted, the tri-state inverters are disabled, and output nodes TNODE and CNODE are permitted to float, saving energy that would otherwise be wasted in leakage currents.

Figure 4B:
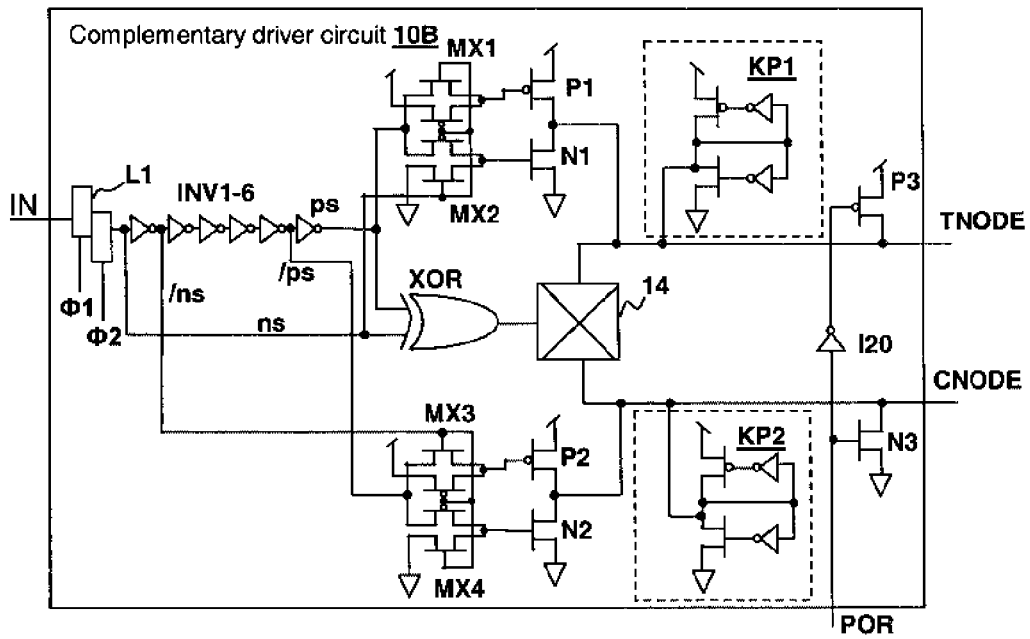
FIG. 4B is a schematic diagram of a driver circuit in accordance with an embodiment of the invention.

Referring now to FIG. 4B, a driver circuit 10B that can be alternatively used to implement the above-described driver circuit 10 of FIG. 1, FIGS. 2A-2C and FIG. 3, is illustrated in accordance with another embodiment of the present invention. Driver circuit 10B is similar to driver circuit 10A of FIG. 4A, and therefore only differences between them will be described below. Rather than allowing output nodes TNODE and CNODE to float, driver circuit 10B uses keeper circuits KP1 and KP2 to hold the states of output nodes TNODE and CNODE. Initialization is provided by a power-on-reset signal POR that activates transistors N3 and P3 (through inverter I20) to set the initial states of output nodes TNODE and CNODE. No enable signal is required in the depicted circuit and the inverters provided by transistor pairs N1, P1 and N2, P2 are pulsed to set the states of output nodes TNODE and CNODE during the pulse that activates pass gate 14. A pair of multiplexers MX1 and MX2 provide control of transistors N1 and P1, and another pair of multiplexers/selectors MX3 and MX4 provide control of transistors N2 and P2, according to the following table:

TABLE I

| ns | ps | N1 gate | P1 gate | N2 gate | P2 gate |
|----|----|---------|---------|---------|---------|
| 0  | 0  | 0       | 1       | 0       | 1       |
| 1  | 0  | 0       | 0       | 1       | 1       |
| 0  | 1  | 1       | 1       | 0       | 0       |
| 1  | 1  | 0       | 1       | 0       | 1       |

As can be seen from the table, line driver transistors N1, P1, N2 and P2 are disabled for all cases where the state of present state and next state signals ps and ns match. Before present state signal ps is set to the state of next state signal ns, one of the transistors will be in the conducting state for each of the line driver supplying output nodes TNODE and CNODE, which is the transistor that will set the proper state of output nodes TNODE and CNODE, according to the state of present state signal ps. The resultant action provides a faster charge/discharge of the output nodes TNODE and CNODE while the pulse generated by logical exclusive-OR gate 14 is active than in the circuit of FIG. 4A, but the device sizes employed for transistors N1, P1, N2 and P2 should be smaller than those employed in pass gate 14, so that charge equalization dominates during the charge equalization period while the pulse is active. Otherwise, the energy savings provided by the charge equalization will be reduced, since current will be sourced by transistors P1 and P2 during the charge equalization period and transistors N1 and N2 will remove charge that could have been used to charge the complementary signal node.

Figure 5:
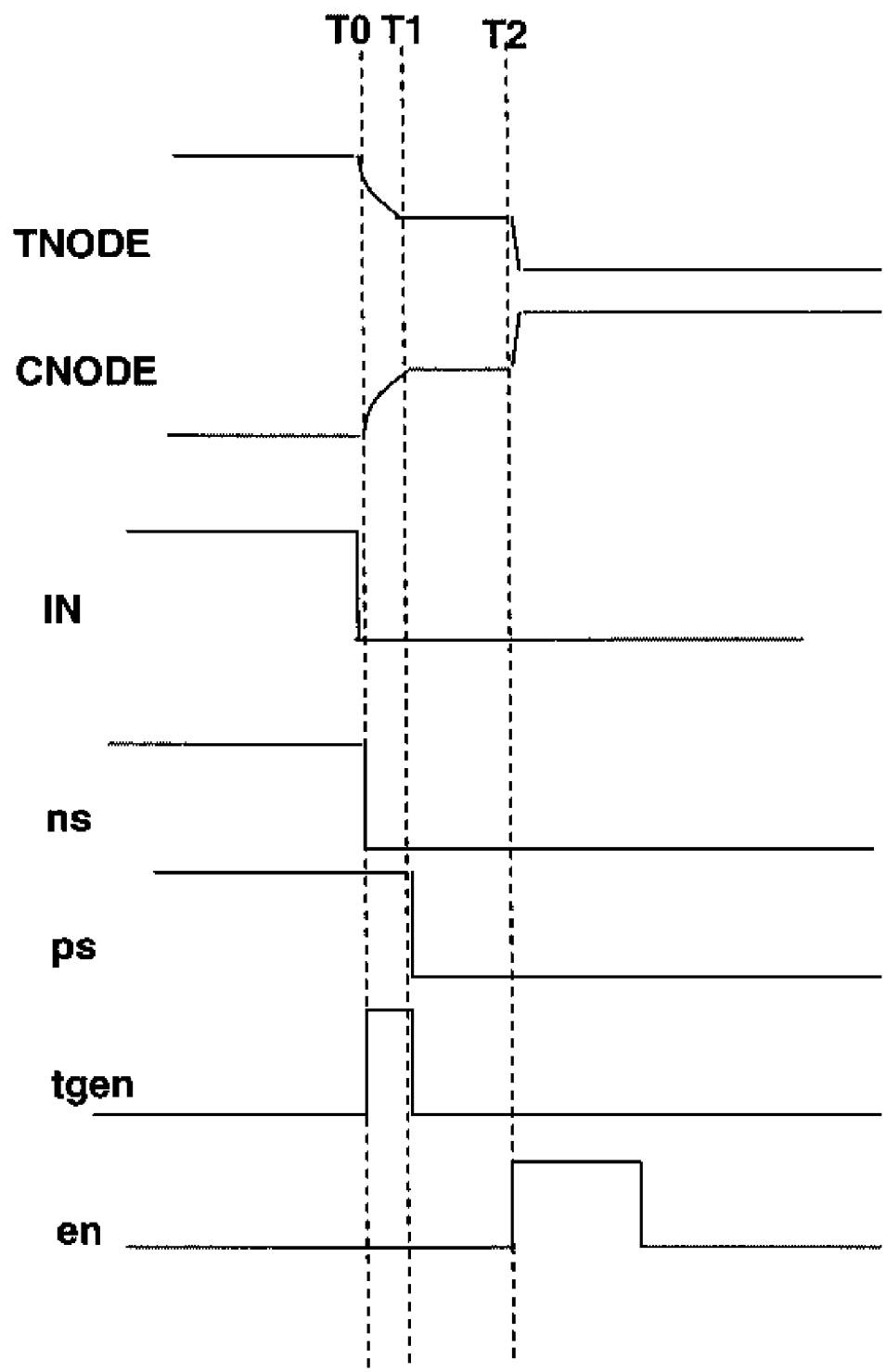
FIG. 5 is a signal diagram showing waveforms within a circuit according to an embodiment of the invention.

Referring now to FIG. 5, operation of the above-described circuits is shown in a signal waveform diagram. The operation of the circuit of FIG. 4A is particularly described, but the operation of the circuit of FIG. 4B is similar except for the presence of enable signal en. At time T0 a change in input signal IN causes the next state signal ns to change. While the present state signal has not changed, the pulse from the change detector circuit output tgen is active, causing the voltages on output nodes TNODE and CNODE to start to equalize. After the end of the pulse on change detector circuit output tgen, the enable signal en is activated, causing the line driver circuits to set output nodes TNODE and CNODE to the proper state, finishing the state change started by the charge equalization. The timing difference between enable signal en and the end of the pulse on change detector circuit output tgen may be any value, and in actual practice, the pulse may overlap enable signal en, by some amount of time.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A circuit, comprising:
    a pair of complementary dynamic circuit nodes having substantial capacitance, wherein the complementary dynamic nodes can represent a state expressing a binary value;
    a logic input for receiving the binary value and for setting a next state of the complementary dynamic circuit nodes in conformity therewith;
    a change detector for detecting a change in the value as received at the input and generating a pulse at an output of the change detector in response to the detected value change, wherein the change detector generates the pulse when the next state of the complementary dynamic circuit nodes differs from a previous state of the complementary circuit nodes, and wherein the change detector does not generate the pulse when the next state of the complementary dynamic circuit nodes is the same as the previous state;
    a pass gate connected between the complementary dynamic circuit nodes and having a control input coupled to the output of the change detector for equalizing a voltage between the complementary dynamic circuit nodes during the pulse; and
    a pair of driver circuits each having an input coupled to the logic input and an output connected to corresponding one of the complementary dynamic circuit nodes for setting the next state of the complementary dynamic circuit nodes after the pulse has terminated.

2. The circuit of claim 1, wherein the pair of driver circuits are enabled by a second pulse, and wherein the circuit further comprises a pair of keeper circuits, each connected to a corresponding one of the complementary dynamic circuit nodes, for retaining the next state set by the pair of driver circuits after the second pulse has terminated.

3. The circuit of claim 2, further comprising a pair of presetting devices each connected to a corresponding one of the complementary dynamic circuit nodes and each having a control input coupled to a power-on-reset input, whereby the complementary dynamic circuit nodes are set to a predetermined state in response to the power-on-reset input.

4. The circuit of claim 1, wherein the pair of driver circuits are enabled by an enable signal, whereby the next state set by the pair of driver circuits is retained while the enable signal is asserted.

5. The circuit of claim 4, wherein each of the pair of driver circuits comprises:
    a pull-up device having a channel connected to the corresponding dynamic circuit node;
    a pull-down device having a channel connected to the corresponding dynamic circuit node;
    a first logic circuit having an output coupled to the gate of the pull-up device, a first input coupled to the enable signal, and a second input coupled to a next state signal, wherein the pull-up device is enabled if the next state is a pull-up condition and the enable signal is asserted;
    a second logic circuit having an output coupled to the gate of the pull-down device, a first input coupled to the enable signal, and a second input coupled to the next state signal, wherein the pull-down device is enabled if the next state is a pull-down condition and the enable signal is asserted.

6. The circuit of claim 1, wherein each of the pair of driver circuits comprises:
    a pull-up device having a channel connected to the corresponding dynamic circuit node;
    a pull-down device having a channel connected to the corresponding dynamic circuit node;
    a first selector having a select input controlled by a present state of the corresponding dynamic circuit node, a first input controlled by the corresponding next state, a second input fixed at a logical voltage value for disabling the pull-up device, and an output coupled to the gate of the pull-up device, wherein the first input is selected when the present state of the corresponding dynamic circuit node is a pull-down condition; and
    a second selector having a select input controlled by the corresponding present state, a first input controlled by the corresponding next state, a second input fixed at a logical voltage value for disabling the pull-down device, and an output coupled to the gate of the pull-down device, wherein the first input is selected when the present state of the corresponding dynamic circuit node is a pull-up condition.

7. The circuit of claim 1, wherein the circuit is a storage device, wherein the complementary dynamic circuit nodes are local bitlines, and wherein the circuit further comprises a plurality of storage elements having data terminals coupled to the local bitlines.

8. The circuit of claim 7, wherein the circuit is a storage array and further comprising:
   a plurality of other pairs of bitlines;
   a plurality of other inputs for setting the states of the other pairs of bitlines, one for each of said other pairs of bitlines and associated with a corresponding one of said other pairs of bitlines;
   a plurality of other change detectors, one for each of said other pairs of bitlines and associated with a corresponding one of said other pairs of bitlines for detecting state changes at the corresponding inputs and generating corresponding pulses at outputs of the change detectors in response to the detected state changes;
   a plurality of other pass gates, one for each of said other pairs of bitlines and connected between a corresponding one of said other pairs of bitlines for equalizing a voltage between the corresponding pair of bitlines during a corresponding pulse; and
   a plurality of other driver circuit pairs, one for each of said other pairs of bitlines and each having an output connected to corresponding one of the corresponding one of the other pairs of bitlines for setting next states of the other pairs of bitlines.

9. The circuit of claim 1, wherein the circuit is a storage device, wherein the complementary dynamic circuit nodes are global bitlines, and wherein the circuit further comprises a read circuit having input terminals coupled to the global bitlines.

10. The circuit of claim 1, wherein the complementary dynamic circuit nodes are complementary evaluation nodes of the dynamic logic circuit.

11. The circuit of claim 10, wherein the dynamic logic circuit is a multiplexer, wherein the dynamic logic circuit further comprises a plurality of gate devices for selecting between inputs of the multiplexer, wherein the complementary dynamic circuit nodes are select enable lines for activating the gate devices.

12. The circuit of claim 1, wherein the change detector comprises:
   a delay line comprising a plurality of logic stages; and
   a logical exclusive-OR gate for comparing an input of a first one of the plurality of logic stages to an output of a second one of the plurality of logic stages to provide the output of the change detector.

13. A circuit, comprising:
   a pair of complementary dynamic circuit nodes having substantial capacitance, wherein the complementary dynamic nodes can represent a state expressing a binary value;
   a logic input for receiving the binary value and for setting a next state of the complementary dynamic circuit nodes in conformity therewith;
   a change detector for detecting a change in the value as received at the input and generating a pulse at an output of the change detector in response to the detected value change, wherein the change detector generates the pulse when the next state of the complementary dynamic circuit nodes differs from a previous state of the complementary circuit nodes, and wherein the change detector does not generate the pulse when the next state of the complementary dynamic circuit nodes is the same as the previous state;
   a pass gate connected between the complementary dynamic circuit nodes and having a control input coupled to the output of the change detector for equalizing a voltage between the complementary dynamic circuit nodes during the pulse;
   a first pull-up device having a channel connected to a first one of the complementary dynamic circuit nodes;
   a first pull-down device having a channel connected to the first dynamic circuit node;
   a first logic circuit having an output coupled to the gate of the first pull-up device, a first input coupled to an enable signal, and a second input coupled to a next state signal, wherein the first pull-up device is enabled if a next state for the first dynamic circuit node is a pull-up condition and the enable signal is asserted;
   a second logic circuit having an output coupled to the gate of the first pull-down device, a first input coupled to the enable signal, and a second input coupled to the next state signal, wherein the first pull-down device is enabled if the next state for the first dynamic circuit node is a pull-down condition and the enable signal is asserted;
   a second pull-up device having a channel connected to a second one of the complementary dynamic circuit nodes;
   a second pull-down device having a channel connected to the second dynamic circuit node;
   a third logic circuit having an output coupled to the gate of the second pull-up device, a first input coupled to an enable signal, and a second input coupled to the next state signal, wherein the second pull-up device is enabled if a next state for the second dynamic circuit node is a pull-up condition and the enable signal is asserted; and
   a fourth logic circuit having an output coupled to the gate of the second pull-down device, a first input coupled to the enable signal, and a second input coupled to the next state signal, wherein the second pull-down device is enabled if the next state for the second dynamic circuit node is a pull-down condition and the enable signal is asserted.

14. A circuit, comprising:
   a pair of complementary dynamic circuit nodes having substantial capacitance;
   an input for setting a state of the complementary dynamic circuit nodes;
   a change detector for detecting a state change at the input and generating a pulse at an output of the change detector in response to the detected state change;
   a pass gate connected between the complementary dynamic circuit nodes and having a control input coupled to the output of the change detector for equalizing a voltage between the complementary dynamic circuit nodes during the pulse;
   a first pull-up device having a channel connected a first one of the complementary dynamic circuit nodes;
   a first pull-down device having a channel connected to the first dynamic circuit node;
   a first selector having a select input controlled by a present state of the first dynamic circuit node, a first input controlled by the next state of the first dynamic circuit node, a second input fixed at a logical voltage value for disabling the first pull-up device, and an output coupled to the gate of the first pull-up device, wherein the first input is selected when the present state of the first dynamic circuit node is a pull-down condition;

a second selector having a select input controlled by the present state of the first dynamic circuit node, a first input controlled by the next state of the first dynamic circuit node, a second input fixed at a logical voltage value for disabling the first pull-down device, and an output coupled to the gate of the first pull-down device, wherein the first input is selected when the present state of the first dynamic circuit node is a pull-up condition;

a second pull-up device having a channel connected a second one of the complementary dynamic circuit nodes;

a second pull-down device having a channel connected to the second dynamic circuit node;

a third selector having a select input controlled by a present state of the second dynamic circuit node, a first input controlled by the next state of the second dynamic circuit node, a second input fixed at a logical voltage value for disabling the second pull-up device, and an output coupled to the gate of the second pull-up device, wherein the first input is selected when the present state of the second dynamic circuit node is a pull-down condition; and a fourth selector having a select input controlled by the present state of the second dynamic circuit node, a first input controlled by the next state of the second dynamic circuit node, a second input fixed at a logical voltage value for disabling the second pull-down device, and an output coupled to the gate of the second pull-down device, wherein the first input is selected when the present state of the second dynamic circuit node is a pull-up condition.

15. A method for reducing power consumption in a dynamic circuit having complementary dynamic circuit nodes with substantial capacitance, comprising:

receiving an input value indicating a next binary state to be imposed on the complementary dynamic circuit nodes;

determining when a change in the received value has occurred such that the next binary state to be imposed on the complementary dynamic circuit nodes differs from a previous binary state of the complementary dynamic circuit nodes;

responsive to determining that the change in the received value has occurred, temporarily coupling the dynamic circuit nodes to at least partially equalize the voltage on the dynamic circuit nodes, wherein the dynamic circuit nodes are not temporarily coupled if the change in the received value has not occurred; and driving the dynamic circuit nodes to impose the next state on the complementary dynamic circuit nodes.

16. The method of claim 15, wherein the driving is continued while an enable signal is asserted.

17. The method of claim 15, wherein the driving is performed by activating driver circuits with a pulse, and further comprising retaining the next state of the complementary circuit nodes using keeper circuits.

18. The method of claim 15, wherein the driving is performed by activating a pull-up device only if the present state of the corresponding bitline is in a pull-down state and activating a pull-up device only if the present state is in a pull-up state.

19. The method of claim 18, wherein the pull-up or pull-down devices are activated only while an enable signal is asserted.

20. The method of claim 15, wherein the determining is performed by performing a logical exclusive-OR comparison of an input signal commanding the next state with a delayed version of the input signal indicating the present state.

* * * * *